United States Patent [19]

Kane et al.

[11] Patent Number: 4,749,842
[45] Date of Patent: Jun. 7, 1988

[54] RING LASER AND METHOD OF MAKING SAME

[75] Inventors: Thomas J. Kane; Leonard P. Pearson, both of Palo Alto, Calif.

[73] Assignee: Lightwave Electronics Co., Mountain View, Calif.

[21] Appl. No.: 46,546

[22] Filed: May 6, 1987

[51] Int. Cl.⁴ ............................................... H01B 1/00
[52] U.S. Cl. ................................ 219/201; 29/592 R; 219/121 LA; 372/36
[58] Field of Search ............ 219/201, 121 LA, 121 L, 219/121 LM; 29/592 R; 372/36, 94, 92, 50, 66, 75

[56] References Cited

U.S. PATENT DOCUMENTS

| 4,571,728 | 2/1986 | Yoshikawa | 372/36 |
| 4,578,793 | 3/1986 | Kane et al. | 372/50 X |
| 4,604,753 | 8/1986 | Sawai | 372/36 |

*Primary Examiner*—C. L. Albritton
*Attorney, Agent, or Firm*—Harry E. Aine

[57] ABSTRACT

In a monolithic ring laser, the ring laser crystal is mounted in a monolithic heated support structure including a layer of solder which is readily softened by elevating the temperature of the heater to permit adjustment and readjustment of the optical alignment of the crystal. The monolithic crystal support includes a block of thermally insulative material interposed between the heating element and the surrounds for thermally isolating the heater and laser crystal from the surrounds.

10 Claims, 2 Drawing Sheets

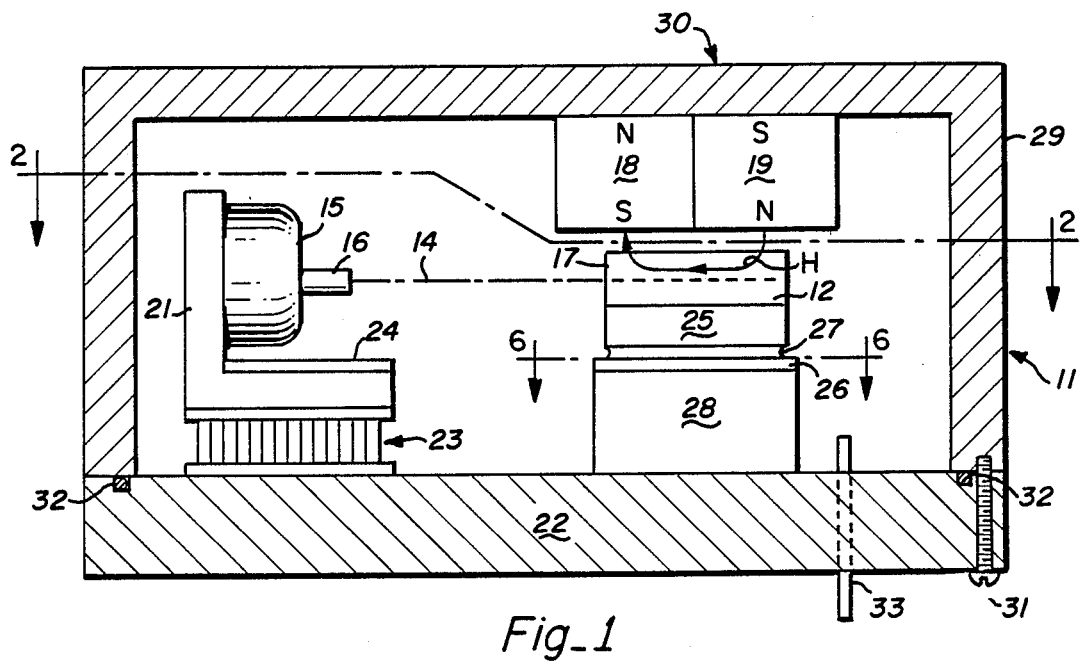
Fig_1
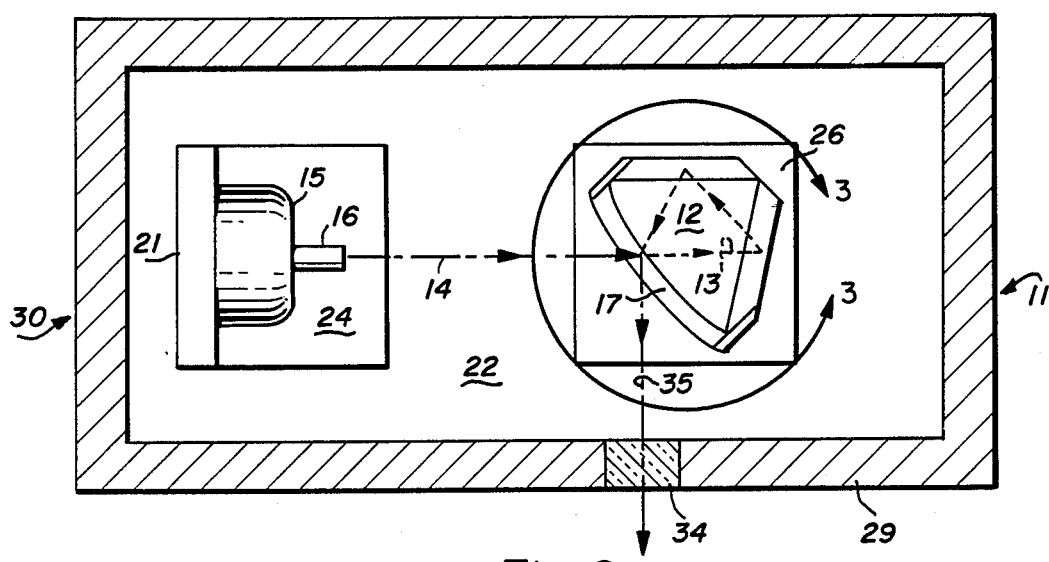
Fig_2

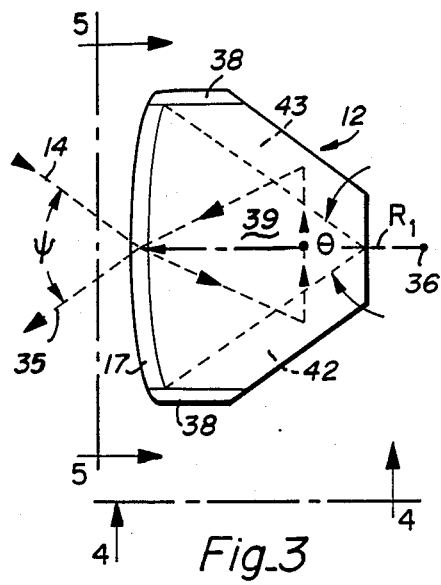
Fig_3
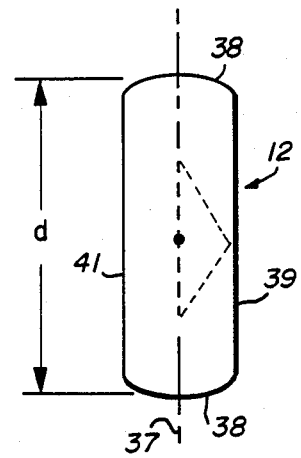
Fig_5
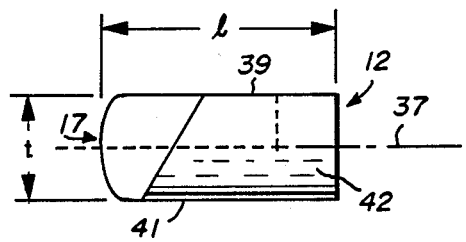
Fig_4
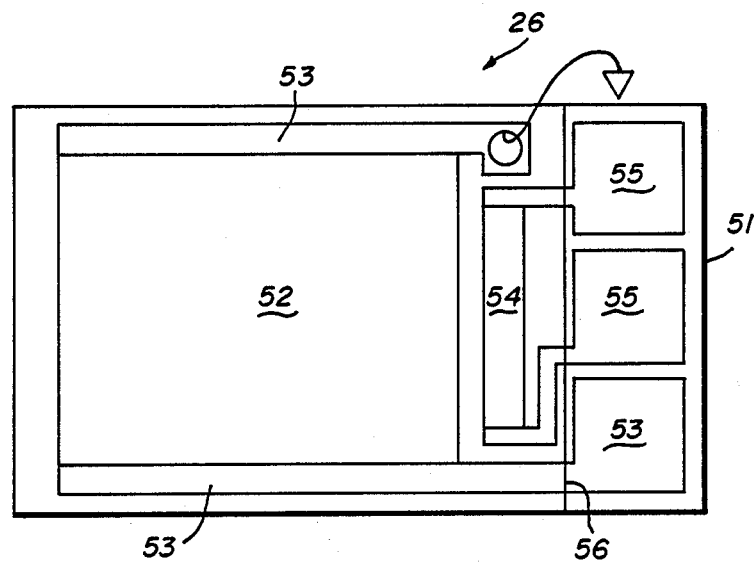
Fig_6

RING LASER AND METHOD OF MAKING SAME

BACKGROUND OF THE INVENTION

The present invention relates in general to a monolithic solid state unidirectional ring laser oscillator and method of making same.

DESCRIPTION OF THE PRIOR ART

Heretofore, monolithic, non-planar ring laser oscillators have been made. The ring oscillator included a monolithic block of lasant material, such as Nd:YAG crystal, on which four reflecting facets (one spherical input-output facet with dielectric coatings and three totally internally reflective facets) are polished to form a non-planar ring resonator.

The ring resonator was immersed in a magnetic field which, by means of a Faraday rotation effect and intrinsic polarization caused the loss for oppositely traveling optical waves within the resonator to be substantially different, thereby supporting oscillation only in the low-loss direction around the ring. When end pumped, the ring oscillator eliminates the effects of spatial hole burning, is insensitive to optical feedback, and operates in a single axial mode. The resultant oscillator's frequency stability makes it an attractive laser source for laser radar, coherent communications, spectroscopy, non-linear optics and inertial rotation sensing. Such a laser ring oscillator is disclosed in U.S. Pat. No. 4,578,793 issued Mar. 25, 1986 and in an article appearing in Optics Letters, Vol. 12, No. 3, of March 1987, pgs. 175-177.

One of the problems encountered in fabricating the aforecited ring laser was that the ring laser crystal was glued to the surface of a heating element used to maintain the crystal at an elevated temperature for thermal tuning of the output wavelength of the laser. Once glued into position, it was extremely difficult to alter the position of the crystal to achieve optimum optical alignment.

Also, in the aforedescribed ring laser, the heater was glued to one surface of one of the magnets employed to produce the magnetic field for the Faraday rotation effect. The magnet was in-turn bonded to a base support structure. There was an excessive heat transfer from the heater to the environs via the magnet and base structure.

SUMMARY OF THE PRESENT INVENTION

The principal object of the present invention is the provision of an improved ring laser and method of fabricating same.

In one feature of the present invention, the member of lasant material defining the laser ring resonator is supported from a support structure via the intermediary of a layer of thermally fusible alloy solder which is heated during the manufacturing process to a sufficient temperature to permit adjustments in the optical alignment of the ring resonator and then allowed to cool to fix the selected alignment.

In another feature of the present invention, the fusible alloy solder is heated to its softening point by means of a heater which also serves as the heater for the lasant material in operation.

In another feature of the present invention, the ring resonator of lasant material and its associated heater are thermally isolated from their support structure by means of a block of thermally insulative material, whereby excessive loss of heat to the surrounds is reduced in use.

Other features and advantages of the present invention will become apparent upon a perusal of the following specification taken in connection with the accompanying drawings wherein:

BRIEF DESCRIPTION OF THE DRAWINGS

FIG. 1 is a longitudinal sectional view of a laser oscillator of the present invention, FIG. 2 is a sectional view of the structure of FIG. 1 taken along line 2—2 in the direction of the arrows, FIG. 3 is an enlarged plan view of the ring resonator portion of the structure of FIG. 2 delineated by line 3—3, FIG. 4 is a side elevational view of the structure of FIG. 3 taken line 4—4 in the direction of the arrows, FIG. 5 is an end view of the structure of FIG. 3 taken along line 5—5 in the direction of the arrows, and FIG. 6 is a plan view of the heater structure of FIG. 1 taken along in the direction of the arrows.

DESCRIPTION OF THE PREFERRED EMBODIMENTS

Referring now to FIGS. 1 and 2, there is shown the ring laser oscillator 11 of the present invention. The ring laser oscillator 11 includes a crystal 12 of lasant magneto-optic material, such as Nd:YAG, faceted for internal reflection of a beam of lasant radiation around a closed path 13 to define a ring resonator, more fully described below with regard to FIGS. 3-5.

The crystal 12 is disposed to receive a beam 14 of optical pumping radiation generated by a laser diode 15, such as a model F4048 commercially available from Toshiba. The output beam 14 of the laser diode 15 is focused by a SELFOC gradient refractive index lens 16 onto an input-output face 17 of the crystal 12. The lens 16 is mounted to and carried from the window of the laser diode 15 by means of an optical cement.

A pair of permanent magnets 18 and 19 are positioned overlaying the crystal 12 and are polarized to produce a strong component of unidirectional magnetic field H, as of 5 KG, in the crystal 12 and parallel to the direction of the optical beam 14 for producing the Faraday rotation effect in the crystal 12. Suitable magnets 18 and 19 are of Nd:iron:boron composition commercially available as type Neigt #28 from I.G. Technology Corporation of Volpariso, Ind.

The laser diode 15 is carried from an L-shaped thermally conductive bracket 21, as of copper, which in-turn is supported from a base plate structure 22, as of copper, via a thermoelectric cooler 23. A thermister 24 is mounted on the L-shaped bracket 21 for sensing the temperature of the laser diode 15.

The lasant crystal 12 is mounted to a major face of a thermally conductive block 25, as of copper, via the intermediary of an optical U.V. curing cement. The block 25 is mounted to a major face of a heater 26 via the intermediary of a relatively thick layer 27 of relatively low melting point solder. A suitable solder is a thermally fusible alloy 52% by weight indium and 48% by weight tin having a melting point of 130° C. commercially available as Indalloy #1E from Indium Corporation of America, Utica, N.Y. In a typical example, the solder layer 27 has a thickness of 0.5 mm.

The heater 26 is carried from a major face of a block 28 of thermally insulative material, such as fused silica, which in-turn is bonded to the base plate 22 via U.V. curing optical cement. U.V. optical cement also bonds the heater 26 to the block 28.

A cup-shaped cap 29 of a thermally conductive material, such as copper, is hermetically sealed over the base plate 22. The cap 29 is held to the base plate 22 by a plurality of screws 31 and the hermetic seal is made by means of a compressible o-ring 32, as of rubber, compressed between the lip of the cup 29 and the base plate 22.

The base plate 22 and cap 29 define an evacuable enclosure 30 housing the ring laser 11. An electrical feedthrough 33 passes electric conductors through the base plate 22 into the enclosure for making electrical connections to the various electrical elements therein.

An optically transmissive window 34 is provided in the sidewall of the cup 29 through which the output optical beam 35 of the laser passes to the surrounds. The vacuum envelope 30 is evacuated and backfilled with dry nitrogen or, alternatively, maintained under vacuum, i.e., $1 \times 10^{-3}$ torr. The latter is preferred as it eliminates undesired convective heat exchange effects. In either case, the optical faces are maintained free of contamination by the clean environment within the envelope 30.

Referring now to FIGS. 3–5, the ring resonator 12 is shown in greater detail. The crystal 12 includes a spherical input face 17 having a radius of curvature $R_1$ as of 16 to 160 mm, with a center 36 lying in the midplane 37 but outside of the crystal. The crystal is cut from cylindrical rod stock, thereby defining cylindrical sidewall portions 38.

The crystal 12 has flat and parallel top and bottom major facets 39 and 41. Rearwardly converging side facets 42 and 43 also tilt inwardly from top to bottom for internally reflecting the incident beam to the top facet 39 and thence, after internal reflection from the top facet, back into the midplane 37 and out the input-output facet 17 as output beam 35.

In a typical physical realization, the crystal 12 is of Nd:YAG material cut from a rod of diameter 0.250". The side facets 42 and 43 converge with an included angle $\theta$ of 37°21'. These facets incline inwardly from top to bottom by an angle of 60°19' from the vertical. The crystal 12 has a thickness t of 0.081" and a length l of 0.189". The input beam 14 and output beam 35 are angularly separated by an angle $\phi$ of 90°. The top facet 39, and side facets 42 and 43, are polished so that with air or vacuum as the surrounding material, the beam 14 will be totally internally reflected. The input face 17 is coated with multiple dielectric layers, in the conventional manner, to provide high transmission, i.e., 90% of the pump radiation at 0.81 $\mu$m and high reflectivity, i.e., 98% at the wavelength of 1.06 $\mu$m of the lasant transition. As an alternative, the crystal 12 is made of Nd:GGG material in which case $\phi = 93°$.

The crystal 12 is mounted to the copper block 25 as of 0.070" thickness via U.V. curing optical cement. The copper block 25 is soldered to the upper face of the heating element 26.

The heating element 26 is shown in greater detail in FIG. 6. The heating element 26 includes an alumina ceramic substrate wafer 51, as of 0.025" thick by 0.250" wide and 0.430" long. An electrical heating element 52 as of 0.190' by 0.250" is deposited on the surface of the substrate 51. Heater metallization traces 53 make electrical connection to opposite sides of the heating element 52. A thermister metallization strip 54 is deposited on the substrate adjacent the heater 52 for sensing the temperature of the substrate. Metal traces 55 make electrical connections to opposite sides of the thermister element 54. An electrical passivation layer 56 overlays the elements 52 and 54. The heater 26 heats the crystal 12 to an elevated operating temperature of about 45.5° C.

The crystal 12 is aligned by heating the heating element to a sufficient temperature, i.e., near 130° C., to melt the solder 27. While the solder 27 is soft, the crystal 12 is aligned with the input pump beam 14 and output window 34. After the correct alignment is obtained, the solder 27 is allowed to solidify by cooling. With the solder, as aforedescribed, the solder does not change its dimensions, i.e., shrink, upon cooling so that the alignment remains fixed.

Also, if the optical alignment needs to be readjusted, this is readily obtained by merely raising the temperature of the heater to soften the solder 27 permitting readjustment of the alignment. The readjusted alignment is preserved by cooling of the heater and solidification of the solder 27.

In a typical example of the present invention, the laser diode pump produces a pump beam of 30 milliwatts (mW) at 0.81 $\mu$m wavelength with 200 mW of d.c. input power. The output beam 34 has six mW of power at 1.06 $\mu$m. The output beam 34 is a single TEM$_{00}$ mode of single frequency with a frequency stability of 5 KH$_z$/sec. frequency excursions.

The advantages of the laser of the present invention include the ability to readily adjust and readjust the optical alignment of the ring laser crystal while enjoying the benefit of a rigid monolithic thermally isolated support for the laser crystal 12.

What is claimed is:

1. In a method for making a ring laser oscillator, the steps of:
    placing a faceted member of lasant material on the optical axis of a source of optical pumping radiation so that pumping radiation emanating from the source will be inducted into the lasant material for optically pumping the lasant material to generate a beam of lasant energy therein which will be reflected internally from the facets of the lasant member into a closed path within the member to define a ring laser,
    providing an electrical heating element for elevating the operating temperature of the lasant material; and
    soldering with a fusible alloy the lasant material and the electrical heating element together into heat-exchanging relation, one with the other, and into bonded relation, one with the other, so as to form a monolithic heater and ring laser oscillator structure.

2. The method of claim 1 including the step of joining a thermally conductive block of material to the lasant material with the block of thermally conductive material being interposed between the heating element and the lasant material, and
    wherein the step of soldering the lasant material and heating element together includes a step of soldering the block of thermally conductive material to the heating element with the fusible alloy being interposed between the block of thermally conductive material and the heating element.

3. The method of claim 2 including the step of glueing the block of thermally conductive material and the lasant material together to form a monolithic composite structure, with the glue being interposed between the lasant material and the block of thermally conductive material.

4. The method of claim 1 wherein the fusible alloy is an alloy of indium and tin.

5. The method of claim 4 wherein the alloy has a preponderance of indium by weight.

6. The method of claim 1 including the steps of:
providing a thermally conductive base member for support of the monolithic heater and ring laser oscillator structure;

interposing a block of thermally insulative material between the base member and the heating element; and bonding the heating element, thermally insulative block and base members together to define a monolithic composite ring laser oscillator, heater, insulative block and base member structure.

7. The method of claim 1 wherein the step of soldering comprises passing sufficient electrical current through said electrical heating element to elevate the temperature of the fusible alloy sufficiently to melt the fusible alloy for soldering the lasant material and heating element together.

8. The product of the method of claim 1.
9. The product of the method of claim 2.
10. The product of the method of claim 6.

* * * * *